United States Patent
Ptacek et al.

(10) Patent No.: US 10,637,468 B2
(45) Date of Patent: Apr. 28, 2020

(54) GALVANICALLY-ISOLATED SIGNALING BETWEEN MODULES WITH STEP-UP TRANSFORMER

(71) Applicant: SEMICONDUCTOR COMPONENTS INDUSTRIES, LLC, Phoenix, AZ (US)

(72) Inventors: Karel Ptacek, Roznov pod Radhostem (CZ); Richard Scott Burton, Phoenix, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 47 days.

(21) Appl. No.: 15/790,196

(22) Filed: Oct. 23, 2017

(65) Prior Publication Data

US 2018/0109257 A1 Apr. 19, 2018

Related U.S. Application Data

(63) Continuation of application No. 15/296,660, filed on Oct. 18, 2016, now Pat. No. 9,954,523.

(51) Int. Cl.
| | |
|---|---|
| *H03K 17/691* | (2006.01) |
| *H03K 17/687* | (2006.01) |
| *H03F 3/195* | (2006.01) |
| *H03F 3/45* | (2006.01) |
| *H04B 1/16* | (2006.01) |

(52) U.S. Cl.
CPC ........... *H03K 17/691* (2013.01); *H03F 3/195* (2013.01); *H03F 3/45179* (2013.01); *H03K 17/6872* (2013.01); *H03F 2203/45306* (2013.01); *H03F 2203/45621* (2013.01); *H04B 1/16* (2013.01)

(58) Field of Classification Search
CPC .......... H03K 3/00–30; H03K 3/313–40; G05F 3/02–30; H04L 25/02–10; H03F 1/26; H03F 1/28; H03F 3/193; H03F 3/1935
See application file for complete search history.

(56) References Cited

U.S. PATENT DOCUMENTS

| | | |
|---|---|---|
| 5,877,667 A | 3/1999 | Wollesen |
| 6,580,724 B1 | 6/2003 | Ouchi et al. |

(Continued)

OTHER PUBLICATIONS

"The Ultimate Flyback: Power Integrations' FluxLink Conversion Technology," EEWeb Electrical Engineering Community Blog, posted Nov. 26, 2014, 5 pages; available at https://www.eeweb.com/blog/eeweb/the-ultimate-flyback-power-integrations-fluxlink-conversion-technology.

(Continued)

*Primary Examiner* — Patrick C Chen
(74) *Attorney, Agent, or Firm* — Ramey & Schwaller, LLP

(57) ABSTRACT

An illustrative embodiment of an integrated circuit configured for galvanically isolated signaling includes a transfer conductor carrying a modulated carrier signal. A floating transfer loop is electromagnetically coupled to the transfer conductor to receive the modulated carrier signal. The floating transfer loop includes a primary of a step-up transformer. A receiver is coupled to a secondary of the step-up transformer to receive the modulated carrier signal in an amplified, differential fashion, and to demodulate the modulated carrier signal to obtain a digital receive signal.

17 Claims, 4 Drawing Sheets

(56) References Cited

U.S. PATENT DOCUMENTS

| | | | |
|---|---|---|---|
| 6,982,605 B2* | 1/2006 | Mondal | H03B 5/1228 331/117 FE |
| 6,998,917 B2 | 2/2006 | Kudo et al. | |
| 7,548,734 B2 | 6/2009 | Lin et al. | |
| 8,064,872 B2 | 11/2011 | Dupuis | |
| 9,143,109 B2 | 9/2015 | Fang et al. | |
| 2005/0270172 A1* | 12/2005 | Bailey | E21B 47/12 340/854.3 |
| 2005/0271148 A1* | 12/2005 | Dupuis | H01L 23/48 375/258 |
| 2010/0243912 A1* | 9/2010 | Richards | H01J 37/248 250/423 R |
| 2012/0286877 A1 | 11/2012 | Koo et al. | |
| 2013/0265132 A1 | 10/2013 | Huang et al. | |
| 2014/0049294 A1 | 2/2014 | Yanagidaira | |
| 2014/0226366 A1* | 8/2014 | Morokuma | H04L 25/0266 363/15 |

OTHER PUBLICATIONS

Shuichi Nagai et al., "A DC-Isolated Gate Drive IC With Drive-by-Microwave Technology for Power Switching Devices," 2012 IEEE International Solid-State Circuits Conference—ISSCC 2012 / Session 23 / Advances in Heterogeneous Integration / 23.3, pp. 404-406.

Swaminathan Sankaran et al., "An Efficient and Resilient Ultra-High Speed Galvanic Data Isolator Leveraging Broad-Band Multi Resonant Tank Electro-Magnetic Coupling," 2015 Symposium on VLSI Circuits Digest of Technical Papers, pp. C210-C211.

W. Zhuo et al., "A Capacitor Cross-Coupled Common-Gate Low-Noise Amplifier," IEEE Transactions on Circuits and Systems—II: Express Briefs, vol. 52, No. 12, Dec. 2005, pp. 875-879.

"Cascode," from Wikipedia, the free encyclopedia; available at https://en.wikipedia.org/wiki/Cascode, as printed on Oct. 17, 2016, 8 pages.

\* cited by examiner

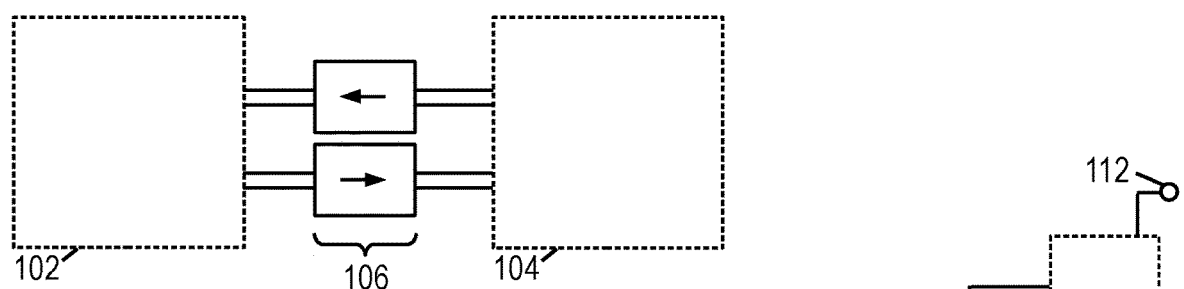
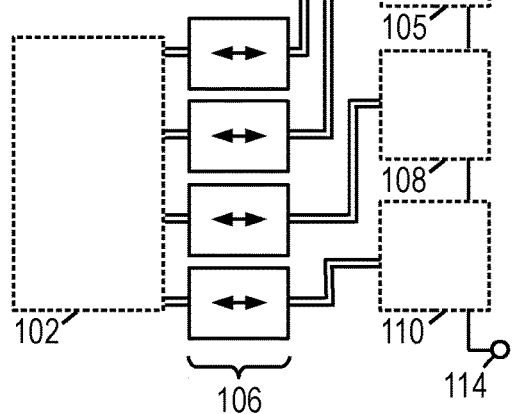
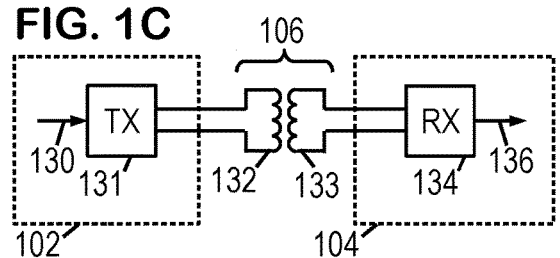
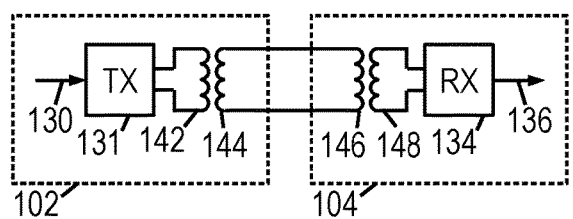

GALVANICALLY-ISOLATED SIGNALING BETWEEN MODULES WITH STEP-UP TRANSFORMER

CROSS-REFERENCE TO RELATED APPLICATIONS

The present application is a continuation of U.S. application Ser. No. 15/296,660, filed 2016 Oct. 18, and titled "Receiver for Resonance-Coupled Signaling" by inventors Karel Ptacek and Richard Burton. The present application relates to U.S. application Ser. No. 15/296,627, filed 2016 Oct. 18, and titled "Resonance-coupled signaling between IC modules" by inventors Karel Ptacek and Richard Burton. Each of these references is hereby incorporated herein by reference.

BACKGROUND

Integrated circuit designers often segregate device components into different modules. Such modularization can reduce fabrication costs and improve system performance. For example, a power converter may include power MOSFETs and other components designed for higher voltages and current loads, as well as small feature-size CMOS logic gates designed for fast control operations with minimal quiescent currents. An integrated circuit designer may choose to segregate the logic components from the power components to prevent the power components from damaging or interfering with the operations of the logic components. If such modules are placed on separate substrates, the manufacturing process applied to each substrate can be tailored for the types of components in each module, thereby minimizing the areal and cost requirements associated with each module while optimizing performance.

During the packaging process, the modules are interconnected as needed to form the desired integrated circuit device. In many cases, it is desirable for these inter-module connections to provide galvanic isolation. Existing techniques such as capacitors, transformers, magnetoresistive couplers, and optoisolators, are each believed to offer insufficient reliability, excessive propagation delay, excessive bulk, and/or excessive attenuation.

SUMMARY

Accordingly, there are disclosed herein various configurations and methods for galvanically isolated signaling between integrated circuit modules. One illustrative embodiment of an integrated circuit configured for galvanically isolated signaling includes a transfer conductor carrying a modulated carrier signal. A floating transfer loop is electromagnetically coupled to the transfer conductor to receive the modulated carrier signal. The floating transfer loop includes a primary of a step-up transformer. A receiver is coupled to a secondary of the step-up transformer to receive the modulated carrier signal in an amplified, differential fashion, and to demodulate the modulated carrier signal to obtain a digital receive signal.

An illustrative embodiment of a multi-module integrated circuit includes a transmitter in a first module, the transmitter configured to provide a modulated carrier signal; a receiver in a second module configured to demodulate the modulated carrier signal; and a galvanically isolated signaling path that conveys the modulated carrier signal from the transmitter to the receiver. The signaling path includes an inter-module floating transfer loop having a first transfer segment in the first module electrically connected to a second transfer segment in the second module, the first transfer segment electromagnetically coupled to the transmitter and the second transfer segment electromagnetically coupled to a second floating transfer loop having a primary of a step-up transformer. The path further includes a secondary of the step-up transformer coupled to the receiver.

An illustrative method embodiment of providing an integrated circuit with at least one connection terminal for receiving galvanically isolated signaling, includes: equipping the integrated circuit with a receiver of a modulated carrier signal, the receiver being connected to a secondary of a step-up transformer; connecting a transfer conductor to the connection terminal; and electromagnetically coupling the transfer conductor to a floating transfer loop that includes a primary of the step-up transformer.

Each of the foregoing embodiments may be employed individually or in combination, together with any one or more of the following features in any suitable combination: (1) the transfer conductor is laterally adjacent to the floating transfer loop. (2) the transfer conductor electrically connects between bonding pads of the integrated circuit to form part of a galvanically-isolated transfer loop that connects the integrated circuit with another integrated circuit that provides the modulated carrier signal. (3) an integrated resonator that mediates the electromagnetic coupling of the floating transfer loop to the transfer conductor. (4) the integrated resonator is a galvanically-isolated transfer loop resonant at a carrier frequency of the modulated carrier signal. (5) the floating transfer loop includes a capacitance in series or parallel with the primary, making the floating transfer loop resonant at a carrier frequency of the modulated carrier signal. (6) the receiver decodes oscillation pulses in the modulated carrier signal as transitions in the digital receive signal. (7) upward and downward transitions are represented as oscillation pulses of different widths. (8) an integrated resonator that mediates the electromagnetic coupling of the second transfer segment to the second floating transfer loop. (9) the electromagnetic coupling mediated by the integrated resonator is provided by placement of the integrated resonator laterally adjacent to the second transfer segment. (10) a second integrated resonator that mediates the electromagnetic coupling of the first transfer segment to the transmitter. (11) each of the integrated resonators is a galvanically-isolated transfer loop resonant at a carrier frequency of the modulated carrier signal. (12) the electromagnetic coupling mediated by the integrated resonator is provided by placement of the integrated resonator laterally adjacent to the second transfer segment. (13) the electromagnetic coupling mediated by the second integrated resonator is provided by placement of the second integrated resonator laterally adjacent to the first transfer segment. (14) the second floating transfer loop includes a capacitance in series or parallel with the primary, making the second floating transfer loop resonant at a carrier frequency of the modulated carrier signal. (15) the electromagnetic coupling includes positioning the transfer conductor laterally adjacent to the floating transfer loop. (16) providing a capacitance in series or parallel to the primary to make the floating transfer loop resonant at a carrier frequency of the modulated carrier signal. (17) the electromagnetic coupling includes providing an integrated resonator laterally adjacent to the transfer conductor and laterally adjacent to the floating transfer loop. (18) the integrated resonator is a galvanically-isolated transfer loop that is resonant at a carrier frequency of the modulated carrier signal. (19) said connection terminal is a first connection terminal, and said connecting includes connecting the first connection terminal to a second connection terminal by the transfer conductor. (20) forming a floating transfer loop by electrically connecting the first and second connection terminals to a remote pair of connection terminals which in turn are electrically connected by a remote transfer conductor. (21) each of said first and second connection terminals comprises a bonding pad on a first substrate, and said remote pair of connection terminals comprises a pair of bonding pads on a second substrate.

BRIEF DESCRIPTION OF THE DRAWINGS

In the drawings:

FIG. 1A is a block diagram of a first illustrative multi-module integrated circuit.

FIG. 1B is a block diagram of a second illustrative multi-module integrated circuit.

FIG. 1C is a schematic of a transformer-based galvanic isolator.

FIG. 1D is a schematic of an integrated transformer-based signal path.

Figure 2A:
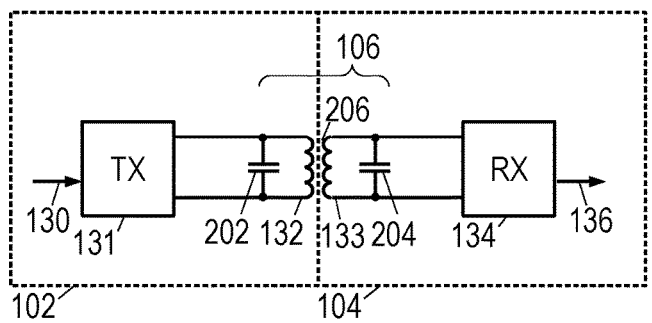
FIG. 2A is a schematic of an illustrative signal path employing coupled parallel resonators.

It should be understood that the drawings and corresponding detailed description do not limit the disclosure, but on the contrary, they provide the foundation for understanding all modifications, equivalents, and alternatives falling within the scope of the appended claims.

DETAILED DESCRIPTION

The disclosed receivers for galvanically isolated signaling methods and systems are best understood in context. Accordingly, FIG. 1A shows a first illustrative multi-module integrated circuit having a first module 102 and a second module 104 interconnected with multiple galvanically isolated signaling paths. Such signaling paths may be desired where at least one of the modules is to be protected from high voltages, high currents, faults, and/or noisy signals in the other module. Each galvanically isolated signaling path includes one or more galvanic isolators 106. The galvanic isolators 106 are generally configured for unidirectional operation, with one port designated for input and the other port designated for output, but bidirectional configurations are also contemplated herein.

Each input and output port of the galvanic isolators 106 is preferably coupled to a module by a pair of conductors for differential signaling, though in some contemplated embodiments a ground connection may serve as one of the input or output conductors to provide single-ended signaling on that port. If both modules 102, 104 share a common ground connection, both the input and output ports may have one conductor coupled to that ground to achieve single-ended signaling on both ports. It should be evident to those skilled in the art where these variations can be applied in the ensuing examples.

FIG. 1B shows a second illustrative multi-module integrated circuit, with the first module 102 coupled to each of four modules 104, 105, 108, and 110, which are arranged in series between terminals 112 and 114. The supply voltages of the four modules 104-110 are suitably laddered to conform to their individual module ratings even as they cooperate to control a significantly larger voltage than what they are rated for individually. The galvanic isolators 106 enable the first module 102 to coordinate the operations of the four modules 104-110 despite their varying supply voltages.

FIG. 1C shows a transformer-based implementation of a galvanic isolator 106. Module 102 includes a transmitter 131 that converts a digital signal 130 into a modulated carrier signal for driving the transformer's primary coil 132. The transformer's secondary coil 133 is electromagnetically coupled to the primary coil 132, enabling the modulated carrier signal to traverse the gap between the coils, albeit while exhibiting some attenuation. (As used herein, the phrase "electromagnetically coupled" is intended to cover all forms of influence exerted by the electrical charges in one conductor on the charges in a second conductor insulated from the first, including inductive forces from magnetic flux coupling, capacitive forces from electric field coupling, and signal transfer from wave field coupling.) At suitable carrier frequencies, the coils 132, 133 can be replaced with parallel conductors that couple electromagnetically, enabling the modulated carrier signal to traverse the intervening gap in much the same way as with adjacent transformer coils.

A receiver 134 in module 104 receives the modulated carrier signal and demodulates it to obtain a digital receive signal 136. Though FIG. 1C shows unidirectional operation, a time multiplexing arrangement of transceivers in each module could be used to provide bidirectional communications.

An external transformer such as that shown in FIG. 1C may be excessively bulky and/or may undesirably require additional steps during the assembly and packing process. Accordingly, FIG. 1D shows an implementation that employs multiple transformers integrated within the modules 102, 104. Transmitter 131 supplies the modulated carrier signal to the primary 142 of an integrated transformer within the first module 102. The transformer secondary 144 transfers the modulated carrier signal to the primary 146 of an integrated transformer within the second module 104. The transformer secondary 148 conveys the modulated carrier signal to the receiver 134.

The use of multiple galvanic isolators on the signal path (e.g., the two transformers) enables any voltage drop between the modules to be divided across the multiple transformer gaps, reducing the voltage drop across each and enabling the voltage of the floating transfer loop to migrate (via charge leakage) to an intermediate value. These properties may be advantageous for the reduced feature sizes typical of integrated transformers, but a greater attenuation may be expected due to the signal's traversal of multiple gaps.

Figure 2B:
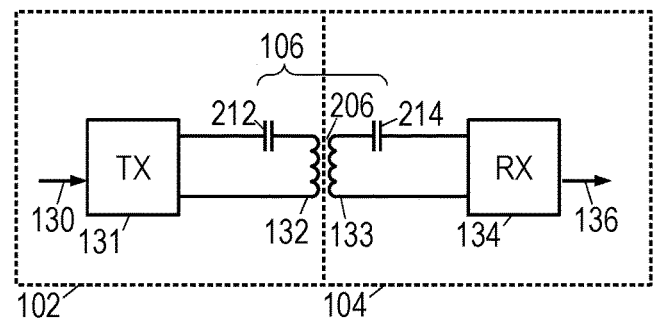
FIG. 2B is a schematic of an illustrative signal path employing coupled serial resonators.

To provide enhanced galvanic isolation with reduced attenuation and minimal complexity, the present disclosure provides for the use of coupled resonators, shown in their most basic form in FIGS. 2A-2B. Here, modules 102, 104 are shown as being adjacent, suggesting these basic forms are most suitable for modules that share the same integrated circuit substrate, for reasons that are discussed further below.

FIG. 2A shares some resemblance to the implementation of FIG. 1C, with the notable differences that galvanic isolator 106 takes the form of an integrated transformer, and the transformer's primary 132 and secondary 133 are each equipped with one of the parallel capacitances 202, 204. The value of capacitance 202 is chosen based on, or jointly with, the self-inductance of primary 132 to provide a resonator in the first module 102 with a resonance frequency that matches the frequency of the carrier signal modulated by transmitter 131. That is, if the carrier frequency is $f_c$ and the self-inductance of primary 132 is $L_p$, the capacitance 202 would be set to:

$$C_p = ((2\pi f_c)^2 L_p)^{-1}$$

Similarly, the value of capacitance 204 is chosen based on, or jointly with, the self inductance of secondary 133 to provide a resonator in the second module 104 with the same resonance frequency. These resonators are electromagnetically coupled via the transformer gap 206.

FIG. 2B shows an alternative to the parallel resonator configuration of FIG. 2A, i.e., a series resonator configuration having a capacitance 212 in series with transformer primary 132 and a capacitance 214 in series with transformer secondary 133. As before, the resonators are electromagnetically coupled via the transformer gap 206. Yet another alternative is to have the coupled resonators include a parallel resonator configuration and a series resonator configuration. The chief distinction between the series and parallel resonator configurations is their driving impedance, but the quality factors of the different configurations can also be a significant consideration.

For the parallel configuration, the driving impedance reaches a maximum at the resonance frequency, whereas at the resonance frequency the driving impedance reaches a minimum for the series configuration. For the series configuration, the quality factor increases as the square root of L/C. For the parallel configuration, the quality factor (at least ideally) increases as the square root of C/L. However, parasitic resistance should be considered for a proper determination of quality factor Q.

The use of coupled resonators enhances the electromagnetic coupling across the gap 206, reducing the attenuation experienced by the signal as it traverses the gap. The resonators further act as bandpass filters, passing the modulated carrier signal but strongly attenuating extraneous noise and out-of-band signals. Higher quality factors provide better filtering and more enhanced coupling, but these considerations may have to be balanced against the larger propagation delays. Resistive components may be introduced as needed to reduce the quality factors. While it may be preferred for some embodiments to employ quality factors Q in excess of 10, quality factors in the range between 1 and 10, inclusive may be suitable for most galvanically isolated signaling applications.

Figure 3A:
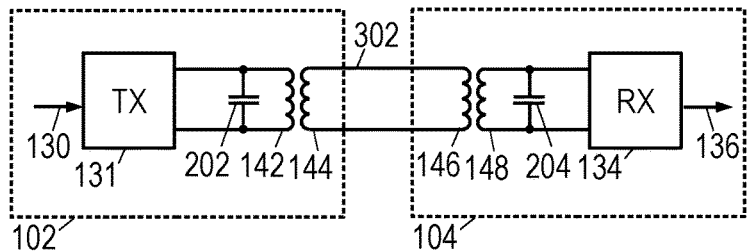
FIG. 3A is a schematic of an illustrative resonantly-coupled signal path with a transfer loop.

FIG. 3A shares some resemblance to the implementation of FIG. 1D, with the notable difference that in the first module 102, transformer primary 142 is provided with a parallel capacitance 202 to form a first resonator, and in the second module 104, transformer secondary 148 is provided with parallel capacitance 204 to form a second resonator electromagnetically coupled to the first resonator via an intermediate transfer loop 302. Unlike the implementation of FIG. 1D, the use of matched resonators provides enhanced coupling, even though that coupling is mediated by the transfer loop 302. The resonant coupling enables the transfer loop to accommodate substantial variation in the electrical characteristics of bonding pads, bond wires, solder balls, etc., which naturally arise from manufacturing imperfections. Thus, the embodiment of FIG. 3A is not just suitable for interconnecting modules on a shared substrate, but also for interconnecting modules on separate substrates.

Figure 3B:
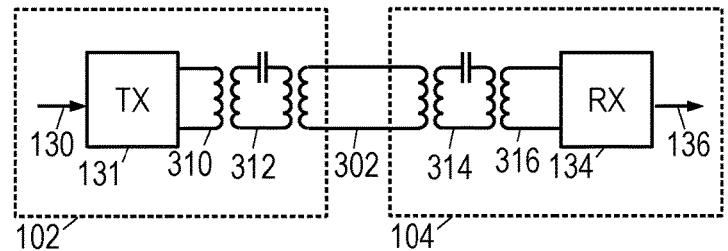
FIG. 3B is a schematic of an illustrative signal path with resonator loops.

FIG. 3B shows an illustrative galvanically isolated signal path that includes two floating resonator loops 312, 314. In the first module 102, transmitter 131 drives transformer primary 310 with the modulated carrier signal. Resonator loop 312 electromagnetically couples with the primary 310 to accept and convey the modulated carrier signal to the transfer loop 302. In the second module 104, resonator loop 314 electromagnetically couples with the transfer loop 302 to accept and convey the modulated carrier signal to transformer secondary 316, which in turn communicates the modulated carrier signal to the receiver 134. The floating loop resonators 312, 314 are matched (i.e., they have the same resonance frequency) to provide resonant coupling mediated by the transfer loop 302. The floating loop design is expected to provide better manufacturing control of the resonance frequency for these resonators. Moreover, the number of electromagnetic coupling gaps is increased to four, further distributing any voltage between the ends of the signal path.

Figure 4:
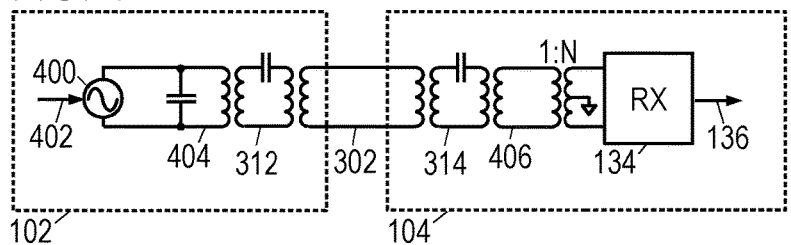
FIG. 4 is a schematic of an illustrative resonantly-coupled signal path with multiple transfer loops.

FIG. 4 shows an illustrative galvanically isolated signal path having multiple transfer loops. In this embodiment, transmitter 131 takes the form of an oscillator 400 whose operation is enabled and disabled by a pulse-width modulated signal 402. When enabled, the oscillator 400 produces a carrier signal oscillating at a carrier frequency that is stabilized by a stabilization resonator 404. The carrier frequency is an adjustable design parameter with higher frequencies offering reduced space requirements and reduced propagation delays together with higher attenuation and higher current demands. In at least some contemplated embodiments, the carrier frequency is in the range of 2-3 GHz. Given the currently available technology, the disclosed principles are expected to be feasible for any carrier frequency in the range from about 100 MHz to whatever the fastest switches will support, e.g., about 100 GHz.

The pulse width modulated signal 402 is derived from digital signal 130 and in at least some contemplated embodiments represents the rising edges of the digital signal 130 with a first pulse width (e.g., 10 to 20 ns) and the falling edges with a second, different pulse width (e.g., 4 to 8 ns). The resulting modulated carrier signal produced by the oscillator 400 is thus able to convey the digital signal's polarity information across the galvanically isolated signaling path.

The floating resonator loop 312 couples with the stabilization resonator 404 to accept and convey the modulated carrier signal to the transfer loop 302. In the second module 104, the transfer loop 302 couples with another floating loop resonator 314 to convey the modulated carrier signal between the two modules 102, 104. Floating loop resonator 314 in turn electromagnetically couples to a second transfer loop 406 to convey the modulated carrier signal. Transfer loop 406 includes the primary of a step-up transformer to amplify the modulated carrier signal. The secondary of the illustrated transformer is center-tapped to ground to convert the modulated carrier signal into differential inputs for the receiver 134 while also suppressing any common mode signal. In at least one contemplated embodiment, the winding ratio of the step-up transformer is 1:8, though other winding ratios may be employed.

Figure 5:
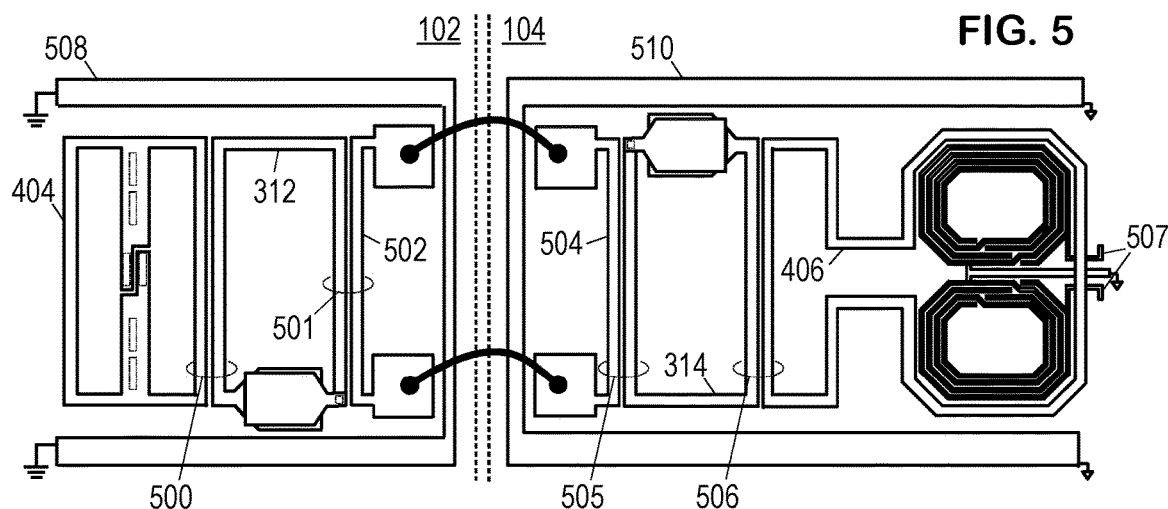
FIG. 5 is a layout diagram of an illustrative resonantly-coupled signal path.

FIG. 5 shows an illustrative layout for the galvanically isolated signal path of FIG. 4. Though not drawn precisely to scale, the layout nevertheless demonstrates principles of providing resonant coupling mediated by transfer loops. FIG. 5 shows the relevant elements of the metallization layers formed on the integrated circuit substrate, and omits the transistors coupled to the oscillator terminals and the receiver terminals.

The center terminals of the stabilization resonator 404 are coupled to an integrated PN junction that provides the capacitive component of the resonator. The arms coupling the center terminals to the surrounding inductive element are also coupled to integrated transistors for supplying a modulated carrier signal to the stabilization resonator 404.

In the first module 102, a pair of conductor segments 500 are arranged in close parallel to provide electromagnetic coupling between the stabilization resonator 404 and the floating loop resonator 312. As both conductor segments can be included with the same metallization layer, this laterally-adjacent coupling configuration provides high a coupling coefficient with minimal manufacturing complexity. A second pair of conductor segments 501 are similarly arranged in close proximity to electromagnetically couple the floating loop resonator 312 to a transfer conductor 502 that connects two connection terminals, shown here in the form of two bonding pads. Two bond wires electrically connect the connection terminals of module 102 to two remote connection terminals of module 104. A transfer conductor 504 electrically connects together the two remote connection terminals (also shown in the form of bonding pads) to complete the transfer loop 302. A third pair of laterally-adjacent conductor segments 505 electromagnetically couples the transfer conductor 504 to the floating loop resonator 314. A fourth pair of laterally-adjacent conductor segments 506 electromagnetically couples the floating loop resonator 314 to transfer loop 406, which includes the primary for the step-up transformer. The transformer secondaries (of which only one layer is shown in FIG. 5) are coupled between the receiver terminals 507.

FIG. 5 further shows a guard ring 508 for the signal path components of the first module 102, and another guard ring 510 for the signal path components of the second module 104, each coupled to their module's ground or some other useful reference voltage. The guard rings 508, 510 operate to shield nearby components of the modules 102, 104 from electromagnetic interference that might otherwise be generated by the high-frequency signals carried by the signal path components.

In the embodiment of FIG. 5, the conductor segments 500, 501, 505, 506 (and any intermediate conductor segments) are expected to provide sufficient inductance and electromagnetic coupling to enable the operation of the galvanically isolated signal path. Capacitance for the resonator loops 312, 314, is shown being implemented as metal-insulator-metal (MIM) plate capacitors. Various suitable alternatives exist and are also contemplated herein. For example, the inductors may be implemented as discrete elements, e.g., coils or spiral inductors. As another example, a hybrid element such as an interdigitated capacitor may provide both inductive and capacitive properties in a single element. The radiofrequency (RF) circuit design literature includes many other resonant structures and electromagnetic coupling strategies suitable for integration into the disclosed systems. In addition to the transformer-based and antenna/transmission-line based coupling strategies of FIG. 5, a capacitive electrode-based coupling strategy could be employed. Matched resonators can be employed to enhance the performance for each of these strategies.

Figure 6:
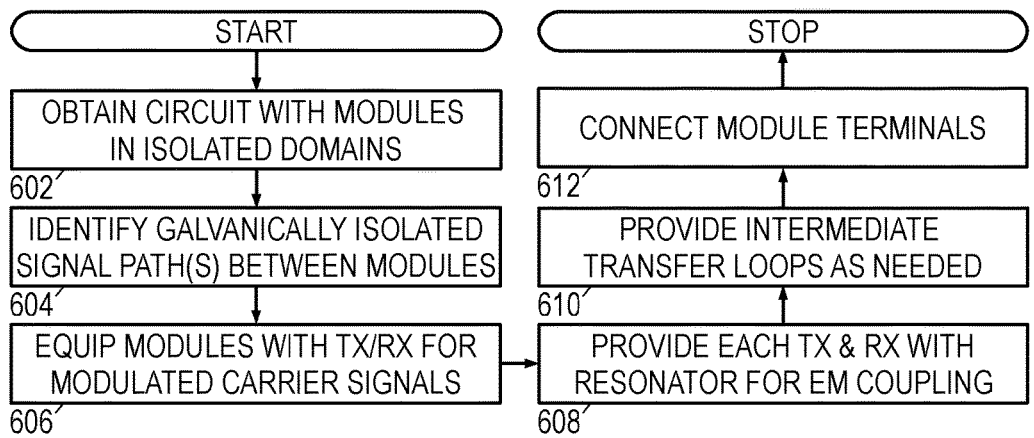
FIG. 6 is a flow diagram of an illustrative method for resonantly-coupled signaling.

FIG. 6 is a flow diagram of an illustrative method for resonantly-coupled signaling. The method begins in block 602 with an integrated device manufacturer obtaining a circuit having modules in isolated domains. Examples of these were discussed with respect to FIGS. 1A-1B. In block 604, the manufacturer identifies the one or more inter-module signaling paths that are to be equipped with galvanic isolation. In block 606, each such signaling path is provided with at least one associated transmitter and at least one associated receiver configured to transmit or receive a modulated carrier signal. Certain particularly suitable receiver configurations and methods are disclosed below with reference to FIGS. 7-9. Time multiplexing may be used to enable a given signaling path to carry multiple signals in one or both directions. In block 608, the manufacturer provides each module with at least one resonator. The resonators are matched to a shared resonance frequency to enable resonant coupling. In block 610, transfer loops are optionally added to provide electromagnetic coupling between the resonators and their associated transmitters or receivers. Transfer conductor segments (incomplete transfer loops) may also be provided to support electromagnetic coupling between the resonators in different modules. In block 612, any such incomplete transfer loops are closed by electrically connecting terminals of such transfer conductor segments.

Figure 7:
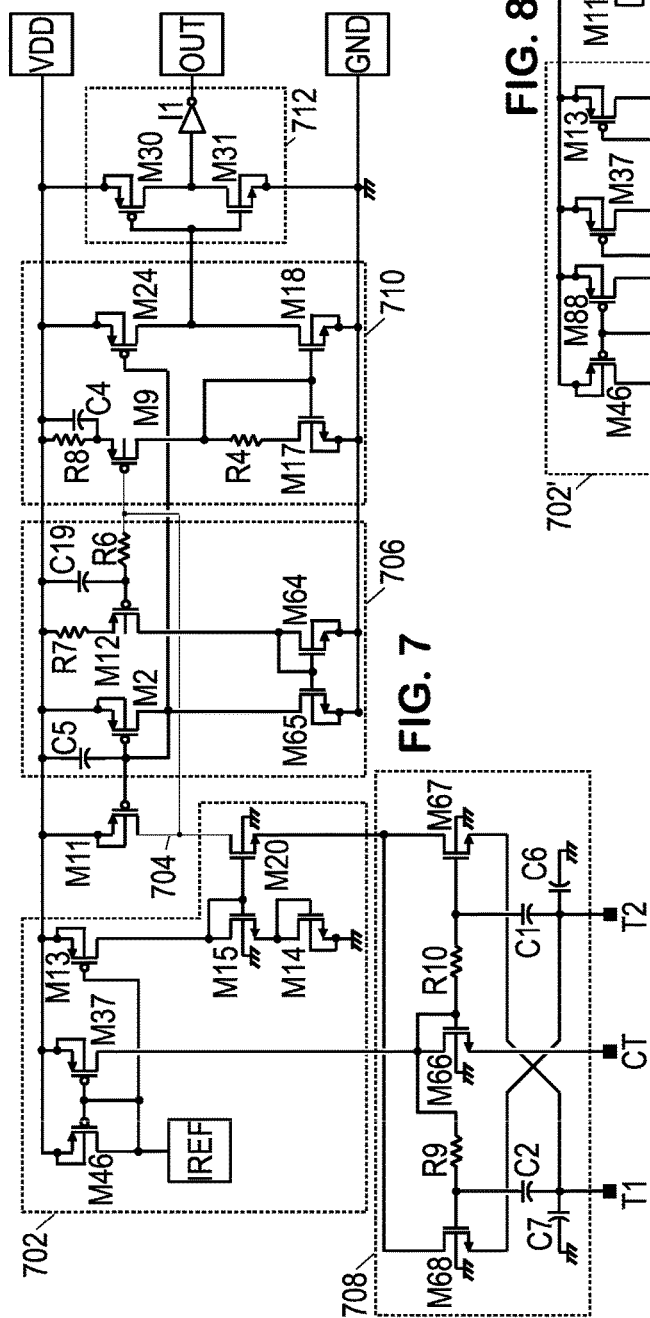
FIG. 7 is a schematic of an illustrative receiver circuit.

FIG. 7 is a schematic of an illustrative receiver circuit embodiment. The illustrative circuit includes 10 terminals for power (VDD, GND), a reference current (IREF), and a digital detection signal (OUT). Three receiver input terminals are also shown (T1, T2, and CT). Receiver terminals T1 and T2 connect to receiver terminals 507 (FIG. 5), which are interconnected by a transformer secondary. Terminal CT connects to the center tap of the transformer secondary, which in the present example is also connected to the local ground (GND). The receiver circuit has been divided into five modules which are individually discussed hereafter: biasing module 702, low pass filtering module 706, detector module 708, comparator module 710, and amplifier module 712.

Biasing module 702 sets nominal bias currents for the detector module 708 based on a reference current drawn from the IREF terminal. A p-channel metal oxide semiconductor field-effect transistor ("P-MOSFET", often abbreviated as "PMOS") M46 has its gate node connected to its drain node and its source node (and body node) connected to the VDD voltage rail. (As a side note, the body nodes of all PMOS devices in the schematic are connected to the VDD rail, and the body nodes of all NMOS devices in the schematic are connected to the GND voltage rail.) As the IREF terminal draws a reference current through PMOS M46, its gate-to-source voltage (Vgs) is set to a corresponding value. When that Vgs is applied to the gates of matching PMOS devices M37 and M13, those devices regulate their current flows at the same value as the reference current independently of their drain voltages (within limits). Thus PMOS M37 supplies a bias current to an n-channel metal oxide semiconductor field-effect transistor ("N-MOSFET", abbreviated "NMOS") M66 in detector module 708, and PMOS M13 supplies a bias current to NMOS M15, with both bias currents equal to the reference current.

Matched NMOS devices M15 and M14 are in series, with each of their gate nodes connected to their drain nodes and the source node of M14 connected to the GND voltage rail. The bias current thus sets the Vgs voltage M14 (and M15)

at the value corresponding to that bias current. The gate voltage of M15 is thus set at 2 Vgs relative to the GND voltage rail, and is coupled to the gate of NMOS device M20. NMOS device M20 has channel width twice that of matched devices M14, M15, M66, M67, and M68, so that the same Vgs would correspond to twice the current flow of those matched devices. NMOS M20's source node is coupled to the drain nodes of both NMOS devices M67 and M68, splitting the doubled bias current between them. The balanced configuration of detector module 708 means that under quiescent conditions the bias current is evenly divided between M67 and M68. Note also that the center tap CT terminal is coupled to ground (see FIGS. 4 & 5), and via their portions of the transformer secondary, so are receiver terminals T1 and T2. The gate node of NMOS M66 is connected to the drain, so the bias current sets the Vgs to the corresponding value. Under quiescent conditions, resistors R9 and R10 communicate the Vgs voltage to the gates of M67 and M68, enabling them to each conduct their portion of the doubled bias current.

Receiver terminal T1 is coupled to the source of M67 and capacitively coupled via capacitor C2 to the gate of M68. Conversely, receiver terminal T2 is coupled to the source of M68 and capacitively coupled via capacitor C1 to the gate of M67, causing NMOS devices M67 and M68 to act as a differential pair. Any common mode component of the signals on T1 and T2 will preserve the balance in the division of the doubled bias current and, at least in the short term, preserve the Vgs of NMOS devices M67 and M68 due to the presence of capacitors C1 and C2. Any difference between the T1 and T2 signals, however, will increase the Vgs of one of the differential pair devices while decreasing the Vgs of the other. As the dependence of current on Vgs is exponential, the net effect of this change is to reduce the impedance of the differential pair. Because a positive or negative signal difference between T1 and T2 has the same effect on impedance, the detector module 708 essentially measures a magnitude of the difference.

The cross-coupled common-gate amplifier configuration of transistors M67 and M68 is expected to be particularly advantageous for detecting high-frequency signals provided via resonant coupling, as such coupling can accommodate the low input impedance typical of the common-gate amplifier configuration. With this accommodation of this configuration's commonly-perceived weakness, the common-gate amplifier configuration offers certain potential advantages relative to the common-source amplifier configuration or the common-drain (aka source follower) configuration, including faster response times, higher gains, improved high-frequency response, and reduced noise enhancement. In other words, the use of a cross-coupled common-gate amplifier configuration is compatible with resonance-coupled signaling, enabling high, robust, detection sensitivity with minimal complexity.

As the bias current from M20 is supplied to the detector module 708, impedance changes of module 708 are measurable as a voltage on the source or drain of NMOS M20. In the schematic, the drain of NMOS M20 is connected to node 704 to provide a response signal voltage. Node 704 is shown as a fine line to indicate that the parasitic capacitance on this node should be minimized to provide maximum detection sensitivity. A feedback element PMOS M11 also has its drain connected to node 704 and its source connected to the VDD voltage rail to supply and regulate the doubled bias current. In the absence of feedback regulation, the gate of M11 could be connected to the drain node, but in the illustrative embodiment, the gate voltage is controlled by a filtering module 706.

Low pass filtering module 706 includes an R-C arrangement, with the response signal from node 704 being supplied to resistor R6 and capacitor C19 storing a low-pass filtered version of the response signal. The capacitor is coupled to the gate of PMOS M12. A resistor R7 between the VDD voltage rail and the source node provides an additional voltage drop to increase the differential voltage between VDD and node 704 and thereby enhance noise immunity. M12's current flow is supplied to a current mirror formed from NMOS devices M64 and M65, thus drawing the same current from PMOS M2, which has its gate node tied to its drain node and its source connected to the VDD voltage rail. To stabilize the feedback loop, a capacitor C5 provides additional low pass filtering of M2's Vgs voltage, yielding a reference signal which the filtering module 706 supplies from the gate of PMOS M2 to the gate of PMOS M11 (and also to the gate of M24 in comparator module 710, discussed later). Based on this reference signal, feedback element PMOS M11 gradually adjusts the doubled bias current through NMOS M20 to regulate long-term variation from the value set by the reference current from the IREF terminal.

The schematic of FIG. 7 further includes a comparator module 710 that receives the response signal from node 704 on the gate of PMOS device M9 and receives the reference signal from capacitor C5 on the gate of PMOS device M24. PMOS device M9 has a high-pass R-C filter arrangement coupled to its source, with resistance R8 and capacitor C4 connected in parallel to the Vdd voltage rail. PMOS M9 thus provides a high-pass filtered response current to an amplifying current mirror arrangement having matched NMOS devices M17 and M18, and a resistor R4 coupled between the gate and drain of NMOS M17. The high-pass filtered response current is provided to the gates of M17 and M18, but the resistor R4 magnifies the gate-to-source voltage (Vgs) required for M17 to conduct that current. NMOS M18 receives the magnified Vgs and is set to conduct a magnified response current, which PMOS M24, receiving the reference voltage, is set to supply only a reference current amount. If the magnified response current exceeds the reference current, the voltage on the drains of M18 and M24 (i.e., the detection signal) drops near the GND rail, whereas if the reference current exceeds the magnified response current, the drain voltage (detection signal) rises near the VDD rail.

Amplifier module 712 includes a PMOS M30 and an NMOS M31 coupled in series between VDD and GND rails, with their gates connected and coupled to receive the detection signal as an input. The output drain voltage of M30 and M31 is an amplified, inverted, ideally digital form of the detection signal. A subsequent inverter I1 may be provided for re-inversion of the digital detection signal with its low state on output terminal OUT representing an asserted detection of an oscillating differential between receiver terminals T1 and T2. A subsequent decoder may derive the transmitted data stream from the digital detection signal.

Figure 8:
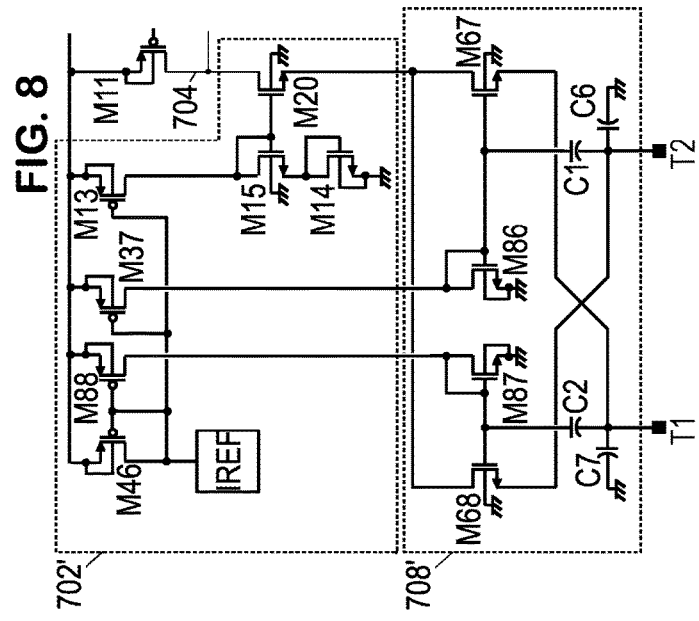
FIG. 8 is a schematic of an illustrative receiver circuit variation.

FIG. 8 presents a variation of the biasing module 702' and the detection module 708'. In this variation, M66 and resistors R9, R10, are replaced by two separated NMOS devices M86 and M87 having their respective drains connect to their respective gates to set independent Vgs reference voltages for NMOS devices M67 and M68. In the biasing module 702', PMOS M37 supplies a biasing current (equal to the reference current Iref) to NMOS M86, while an additional PMOS M88 supplies the same biasing current to NMOS M87.

Figure 9:
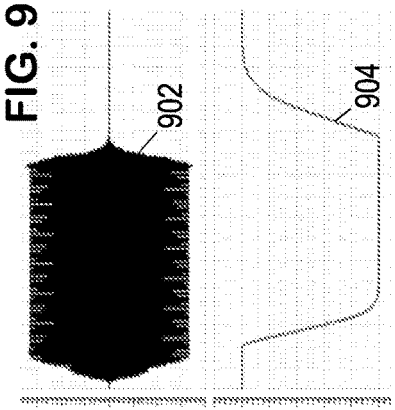
FIG. 9 is a graph of illustrative receive and detection signals.

In both configurations, receive signal fidelity is sacrificed to gain a very high RF sensitivity with low latency and minimal quiescent current requirements. FIG. 9 shows an illustrative 30 mV differential signal applied between terminals T1, T2, and a simulated detection signal produced by comparator module 710 with VDD at 5V. Measuring between the 3 dB points, the pulses are each 50 ns long and the detection latency is approximately 15 ns.

It will be appreciated by those skilled in the art that the words during, while, and when as used herein relating to circuit operation are not exact terms that mean an action takes place instantly upon an initiating action but that there may be some small but reasonable delay(s), such as various propagation delays, between the reaction that is initiated by the initial action. Additionally, the term while means that a certain action occurs at least within some portion of a duration of the initiating action. The use of the word approximately or substantially means that a value of an element has a parameter that is expected to be close to a stated value or position. However, as is well known in the art there are always minor variances that prevent the values or positions from being exactly as stated. It is well established in the art that variances of up to at least ten percent (10%) are reasonable variances from the ideal goal of exactly as described.

The terms first, second, third and the like in the claims or/and in the Detailed Description, as used in a portion of a name of an element are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein.

Reference to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but in some cases it may. Furthermore, while some embodiments described herein include some but not other features included in other embodiments, combinations of features of different embodiments are meant to be within the scope of the invention, and form different embodiments, as would be understood by those skilled in the art. Inventive aspects may lie in less than all features of a single foregoing disclosed embodiment.

These and numerous other modifications, equivalents, and alternatives, will become apparent to those skilled in the art once the above disclosure is fully appreciated. It is intended that the following claims be interpreted to embrace all such modifications, equivalents, and alternatives where applicable.

What is claimed is:

1. An integrated circuit configured for galvanically isolated signaling, the integrated circuit comprising an integrated circuit substrate manufactured to implement:
   a transfer conductor carrying a modulated carrier signal;
   a floating transfer loop electromagnetically coupled to the transfer conductor to receive the modulated carrier signal, wherein the floating transfer loop includes a primary of a step-up transformer;
   a receiver coupled to a secondary of the step-up transformer to receive the modulated carrier signal in an amplified, differential fashion, wherein the receiver demodulates the modulated carrier signal to obtain a digital receive signal; and
   an integrated resonator that mediates the electromagnetic coupling of the floating transfer loop to the transfer conductor, wherein the integrated resonator is a galvanically-isolated transfer loop resonant at a carrier frequency of the modulated carrier signal.

2. The integrated circuit of claim 1, wherein the transfer conductor is laterally adjacent to the floating transfer loop.

3. The integrated circuit of claim 2, wherein the transfer conductor electrically connects between bonding pads of the integrated circuit to form part of a galvanically-isolated transfer loop that connects the integrated circuit with another integrated circuit that provides the modulated carrier signal.

4. The integrated circuit of claim 1, wherein the floating transfer loop includes a capacitor in series or parallel with the primary, making the floating transfer loop resonant at a carrier frequency of the modulated carrier signal.

5. The integrated circuit of claim 1, wherein the receiver decodes oscillation pulses in the modulated carrier signal as transitions in the digital receive signal.

6. The integrated circuit of claim 5, wherein upward and downward transitions are represented as oscillation pulses of different widths.

7. A multi-module integrated circuit that comprises a first module and a second module interconnected in an integrated circuit device package that includes:
   a transmitter in the first module, the transmitter configured to provide a modulated carrier signal;
   a receiver in the second module configured to demodulate the modulated carrier signal; and
   a galvanically isolated signaling path that conveys the modulated carrier signal from the transmitter to the receiver, wherein the signaling path includes:
      an inter-module floating transfer loop that includes a first transfer segment in the first module electrically connected to a second transfer segment in the second module, the first transfer segment electromagnetically coupled to the transmitter and the second transfer segment electromagnetically coupled to a second floating transfer loop that includes a primary of a step-up transformer; and
      a secondary of the step-up transformer coupled to the receiver.

8. The multi-module integrated circuit of claim 7, further comprising an integrated resonator that mediates the electromagnetic coupling of the second transfer segment to the second floating transfer loop.

9. The multi-module integrated circuit of claim 8, wherein the electromagnetic coupling mediated by the integrated resonator is provided by placement of the integrated resonator laterally adjacent to the second transfer segment.

10. The multi-module integrated circuit of claim 8, further comprising a second integrated resonator that mediates the electromagnetic coupling of the first transfer segment to the transmitter, wherein each of the integrated resonators is a galvanically-isolated transfer loop resonant at a carrier frequency of the modulated carrier signal.

11. The multi-module integrated circuit of claim 10, wherein the electromagnetic coupling mediated by the integrated resonator is provided by placement of the integrated resonator laterally adjacent to the second transfer segment, and wherein the electromagnetic coupling mediated by the second integrated resonator is provided by placement of the second integrated resonator laterally adjacent to the first transfer segment.

12. The multi-module integrated circuit of claim 7, wherein the second floating transfer loop includes a capacitance in series or parallel with the primary, making the second floating transfer loop resonant at a carrier frequency of the modulated carrier signal.

13. A method of processing an integrated circuit substrate to implement an integrated circuit with at least one connection terminal for receiving galvanically isolated signaling, the method comprising:
equipping the integrated circuit with a receiver of a modulated carrier signal, the receiver being connected to a secondary of a step-up transformer;
connecting a transfer conductor to the connection terminal; and
electromagnetically coupling the transfer conductor to a floating transfer loop that includes a primary of the step-up transformer, said electromagnetic coupling including: providing an integrated resonator laterally adjacent to the transfer conductor and laterally adjacent to the floating transfer loop, the integrated resonator being a galvanically-isolated transfer loop that is resonant at a carrier frequency of the modulated carrier signal.

14. The method of claim 13, wherein said electromagnetic coupling includes positioning the transfer conductor laterally adjacent to the floating transfer loop.

15. The method of claim 14, further comprising providing a capacitor in series or parallel to the primary to make the floating transfer loop resonant at a carrier frequency of the modulated carrier signal.

16. A method of processing an integrated circuit substrate to implement an integrated circuit with a first connection terminal for receiving galvanically isolated signaling, the method comprising:
equipping the integrated circuit with a receiver of a modulated carrier signal, the receiver being connected to a secondary of a step-up transformer;
connecting the first connection terminal to a second connection terminal with a transfer conductor;
electromagnetically coupling the transfer conductor to a floating transfer loop that includes a primary of the step-up transformer; and
forming an inter-module floating transfer loop by electrically connecting the first and second connection terminals to a remote pair of connection terminals which in turn are electrically connected by a remote transfer conductor.

17. The method of claim 16, wherein each of said first and second connection terminals comprises a bonding pad on a first substrate, and wherein said remote pair of connection terminals comprises a pair of bonding pads on a second substrate.

* * * * *